United States Patent [19]

Yamaguchi et al.

[11] Patent Number: 5,247,242
[45] Date of Patent: Sep. 21, 1993

[54] OUTPUT MODULE

[75] Inventors: Yutaka Yamaguchi; Toshihide Iinuma, both of Tokyo, Japan

[73] Assignees: Toshiba Kikai Kabushiki Kaisha, Tokyo; Shibaki Controls, Inc., Numazu, both of Japan

[21] Appl. No.: 837,699

[22] Filed: Feb. 19, 1992

Related U.S. Application Data

[63] Continuation of Ser. No. 589,814, Sep. 26, 1990, abandoned.

[30] Foreign Application Priority Data

Jan. 12, 1990 [JP] Japan .................................. 2-4784

[51] Int. Cl.$^5$ .................................................. H02J 4/00
[52] U.S. Cl. ........................................ 323/324; 323/239; 307/112
[58] Field of Search ................. 323/239, 324; 307/112

[56] References Cited

U.S. PATENT DOCUMENTS

| | | | |
|---|---|---|---|
| 3,160,808 | 12/1964 | Kruse ........................... | 323/239 |
| 3,244,964 | 4/1966 | Greening et al. .................. | 323/324 |
| 3,385,973 | 5/1968 | Abrams et al. ..................... | 323/324 |
| 3,440,445 | 4/1969 | Kusa ............................ | 323/239 |
| 3,548,290 | 12/1970 | Swinehart ........................ | 323/239 |
| 3,668,434 | 6/1972 | Brungsburg ....................... | 323/324 |
| 3,940,680 | 2/1976 | Todokoro et al. .................. | 363/142 |
| 4,016,484 | 4/1977 | Crouthamel ....................... | 323/324 |
| 4,031,458 | 6/1977 | Ichikawa ......................... | 323/324 |
| 4,088,937 | 5/1978 | Uchida et al. .................... | 363/142 |
| 4,176,288 | 11/1979 | Komatsu et al. ................... | 323/239 |
| 4,300,090 | 11/1981 | Weber ............................ | 323/237 |
| 4,302,717 | 11/1981 | Olla ............................. | 323/324 |
| 4,641,234 | 2/1987 | Bonal ............................ | 363/142 |
| 4,870,340 | 9/1989 | Kral ............................. | 323/239 |
| 4,948,987 | 8/1990 | Weber ............................ | 323/239 |
| 5,081,411 | 1/1992 | Walker ........................... | 323/324 |

Primary Examiner—J. L. Sterrett
Attorney, Agent, or Firm—Cushman, Darby & Cushman

[57] ABSTRACT

An output module which is used in a factory automation control apparatus is disclosed. The output module is connectable to both of AC and DC power sources, which is constituted by a control element controlled by the output signal in the factory automation control apparatus, and a drive element being bi-directionally conducted by the signal of the factory automation control apparatus. A first embodiment uses a full wave rectifier to rectify the current from/to the load, and a second embodiment uses two opposite channel type transistors to respectively conduct during different polarities.

2 Claims, 3 Drawing Sheets

OUTPUT MODULE

This is a continuation of application Ser. No. 07/589,814, filed on Sep. 26, 1990, now abandoned.

BACKGROUND OF THE INVENTION

1. Field of the Invention

This invention relates to a circuit for use in a factory automation apparatus, for example, a programmable controller, a numerical control apparatus, a robot controller, or the like.

More specifically, this invention relates to an output module of a factory automation apparatus, which is used as an electronic switch.

2. Description of the Related Art

Output modules are used for turning ON/OFF of loads in numerical control apparatus, program controllers and robot controllers.

The loads, which are the object of control, are operated with many kinds of power sources, such as AC 100 V, AC 200 V, DC 24 V, DC 100 V or the like. Therefore, in the related art, special output circuits are prepared for these power sources, which are suitable to the object of control. These special output circuits are called, for example, an output module for AC 100 V, an output module for DC 24 V or another descriptive name which explains the voltage for which it is intended.

Output modules of the related art are shown in FIG. 7 and FIG. 8.

In FIG. 7, output signal $\overline{ON}$ is input to light emitting diode 200a of optoisolator photo coupler 200 though inverter driver 100. The collector of photo-transistor 200b is connected to resistor 300 and the emitter of photo-transistor 200b is connected to resistor 400. Other terminals of these resistors are connected to output terminal OT 1 and output terminal OT 3 respectively. The other terminal of resistor 400 is connected to the base of transistor 500 and the output terminal OT 3 side of resistor 400 is also connected to emitter of transistor 500. The collector of transistor 500 is connected to output terminal OT 2. The positive pole of DC power supply DPS is connected to output terminal OT 1 and also connected to output terminal OT 2 via load LD. Further the negative pole of DPS is connected to output terminal OT 3.

In this organization of the related art, photo diode 200a emits light in response to the ON/OFF state of output signal ON which is input to inverter driver 100, and then photo-transistor 200b also turns ON/OFF. Accordingly base emitter voltage of transistor 500 is supplied in accordance with the divided voltage ratio between resistor 300 and resistor 400 and then transistor 500 turns ON/OFF. This provides a current path so that the power supply to load LD is achieved.

FIG. 8 shows the ON/OFF signal of output signal ON applied to inverter driver 100 and passes through photo-triac 600, to cause triac 700 to turn ON/OFF. Further load LD which is connected between anode and cathode of triac 700, which is for instance, a solenoid or the like, is driven by alternating current power source APS.

As mentioned above, it is conventional to prepare a semiconductor triac for an AC load and to use a transistor for DC load.

However, a triac generally can not turn ON/OFF a DC load. Also when a transistor is used for switching a DC load, an N channel transistor or an P channel transistor must be used properly based on the polarity of a load.

Therefore, in the related art, special types of output modules have been prepared in response to the kind of power sources of the loads.

Thus manufacturers must make and prepare various kinds of output modules for different requests from users. This results in complexity in the production line, complexity in the process control and a problem that much storage space is required for the different types.

Further, OEM manufacturers must use output modules properly, and test and confirm many kinds of output modules. This also results in complexity of the product manufacturing, and in the possibility of component damage if the wrong one is used.

Further more end users must keep many kinds of output modules. This is also inconvenient.

Accordingly it is desirable to provide one kind of output module which is able to deal with various kinds of power sources.

SUMMARY OF THE INVENTION

It is an object of the present invention to provide an output module which is able to deal with various kinds of power sources by preparing one kind of output module.

According to this invention, there is provided an output module used in a factory automation apparatus having both AC and DC power sources, comprising a control element turned ON/OFF by the output signal in the factory automation apparatus and a drive element being bi-directionally conducted by the signal of the control element, and being connected to both the DC and AC power sources.

BRIEF DESCRIPTION OF THE DRAWINGS

The invention can be fully understood by reference to the accompanying drawings in which.

DETAILED DESCRIPTION OF THE PREFERRED EMBODIMENTS

The preferred embodiments of the present invention will now be described in more detail with reference to the accompanying drawings.

Figure 1:
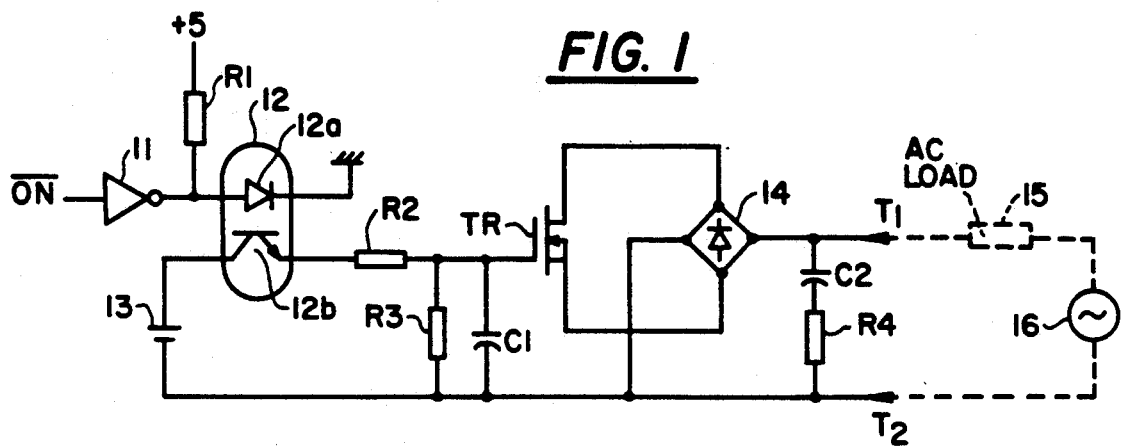
FIG. 1 is a circuit diagram showing an output module embodying the present invention.
Figure 2:
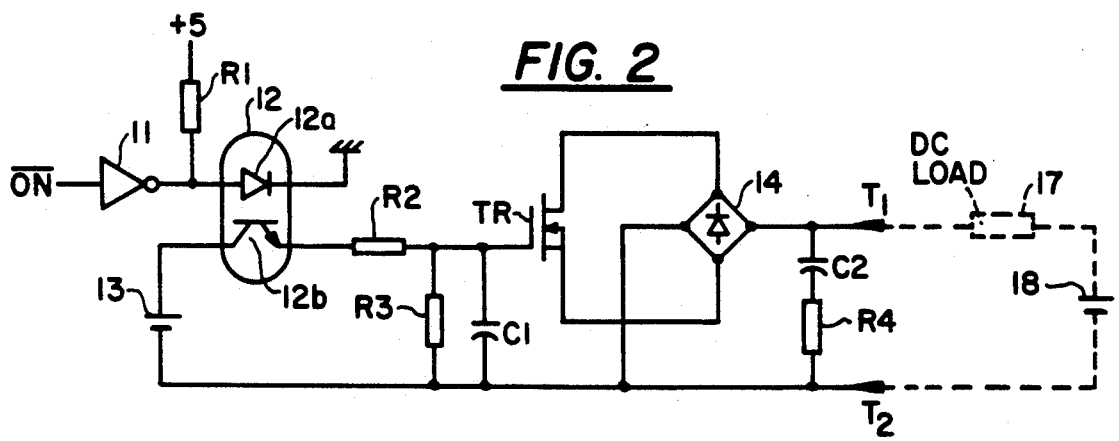
FIG. 2 is a circuit diagram showing the manner in which the load in the embodiment of FIG. 1 is changed.
Figure 3:
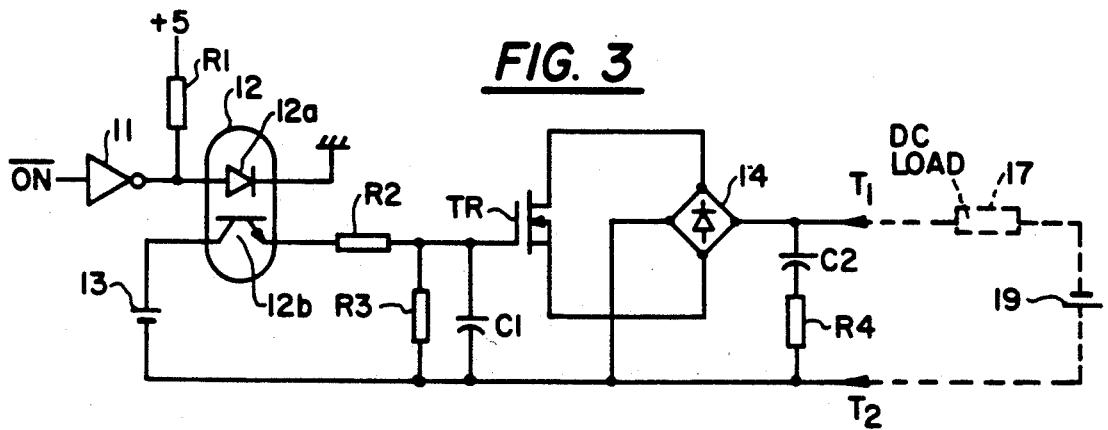
FIG. 3 is a circuit diagram showing the manner in which the load in the embodiment of FIG. 1 is also changed.

Three circuits constituting a first embodiment of the present invention are shown in FIG. 1 through FIG. 3 respectively. The circuits are same for each but each load connected to each circuit is different.

FIG. 1 shows a load for AC power source connected to the circuit. In FIG. 2 a load for DC power source with a first polarity and in FIG. 3 a load for DC power source is connected, while the polarity of DC power source is different.

First of all, the construction of the circuit in the first embodiment is described. The Circuit essentially includes photo coupler 12, transistor TR and bridge full wave rectification circuit 14 which is a bridge circuit of silicon diodes. The circuit also includes associated circuitry, such as inverter driver 11, resistors R1-R4 and capacitors C1-C2.

Output signal $\overline{ON}$ is applied to inverter driver 11 and passes through it and reaches the anode of photo-diode 12a in photo-coupler 12. The cathode of photo-diode 12a is connected to an internal ground level. The connection point of inverter driver 11 and photo diode 12a is connected to +5 V power source through current limiting resistor R1.

The collector of photo transistor 12b in photo coupler 12 is connected to positive pole of DC power source 13 and the emitter is connected to the gate of MOS type transistor TR through resistor R2. The ON resistance of the transistor TR is selected to be a low resistance type and the output side of bridge full wave rectifier circuit 14 is connected between the source and the drain thereof. The input sides of bridge full wave rectifier circuit 14 are connected to terminal T1 and terminal T2. Terminal T2 is connected to the negative pole of DC power source 13. Resistor R3 and capacitor C1 are connected in parallel between the negative pole and the gate of transistor TR. Resistor R2 and resistor R3 are divider resistors in order to divide the voltage of DC power source 13 and apply the proper divided voltage to the gate of transistor TR. Capacitor C2 and resistor R4 are connected in series to constitute a snubber circuit to absorb the noise which is generated in the load when transistor TR turns on or off. The operation of the circuit is described as follows:

As shown in FIG. 1, it is assumed that AC load 15 and AC power source 16 are connected between terminal T1 and terminal T2 and AC power source 16 is applied to control AC load 15.

When output signal $\overline{ON}$ goes to a low level, photo diode 12a in photo coupler 12 emits light by applying the current from +5 V power supply. The light of the photo diode causes photo transistor 12b to turn on. The voltage divided by resistor R2 and resistor R3 is then applied to the gate of transistor TR. The voltage must be high enough to make transistor TR turn on so that transistor TR conducts. Then DC current output from bridge full wave rectification circuit flows into transistor TR between the drain and the source thereof. Accordingly, the current from AC power source 16 is applied to AC load 15 which is connected at the input side of the bridge full wave rectification circuit 14.

When output signal $\overline{ON}$ goes to a high level, photo diode 12a in photo coupler 12 does not emit light. Therefore, photo transistor TR turns off and no longer conducts. Accordingly transistor TR turns off and the secondary of bridge full wave rectification circuit becomes open status. Thus the power is not applied to the AC load 15.

The second example is shown in FIG. 2, in which a minus common circuit of DC power source 18 and DC load are connected between terminal T1 and Terminal T2.

The third type of load is shown in FIG. 3, in which a plus common circuit of DC power source 19 and DC load 17 are connected between terminal T1 and terminal T2.

In the examples, rectification circuit 14 is a full wave rectification circuit connected so that the current can flow into the load when transistor TR turns on even though the primary DC power source has either plus or minus polarity.

Since details of operation of these elements are identical to those of FIG. 1, another detailed description of this operation is believed unnecessary.

Figure 4:
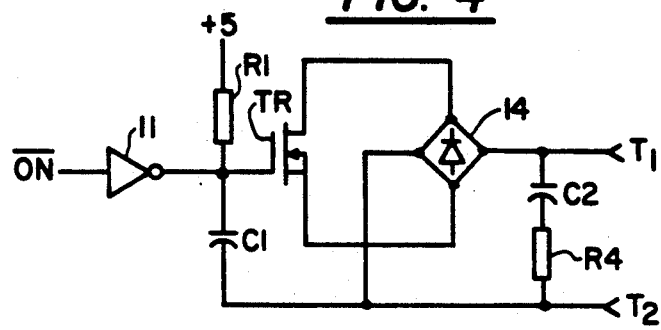
FIG. 4 is a circuit diagram showing a modification of the embodiment shown in FIG. 1.

FIG. 4 shows another modification which is a circuit without a photo coupler. This embodiment is suitable to apply to a case in which the circuit is arranged in a small package because the photo coupler is not used. Also this embodiment would be more economical to produce.

Figure 5:
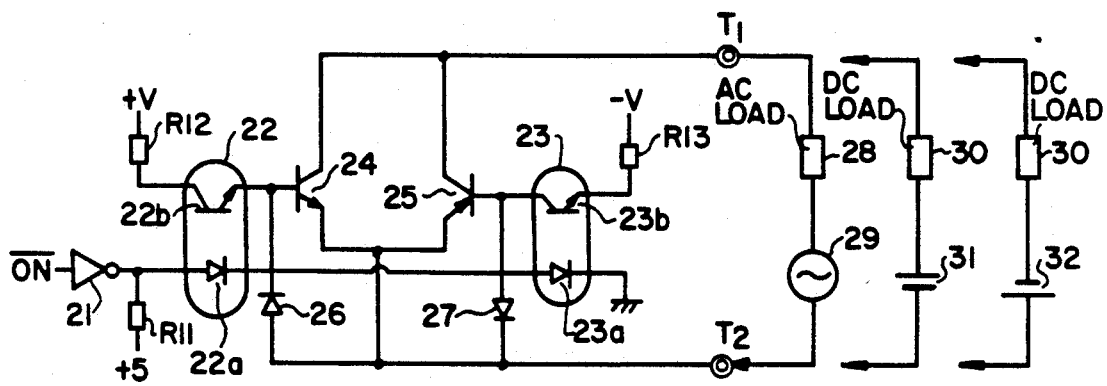
FIG. 5 is a circuit diagram showing a second embodiment.

Another embodiment of the present invention is shown in FIG. 5.

This embodiment is different from the embodiment described above, and two transistors, 24 and transistor 25, are provided in the embodiment instead of the rectification circuit 14.

In the embodiment, output signal $\overline{ON}$ is input to inverter driver 21 and passes through to the anode of photo diode 22a in photo coupler 22. The cathode of photo diode 22a is further connected to the anode of photo diode 23a in photo coupler 23, and the cathode of photo diode 23a is grounded. The connection point of the output of inverter driver 21 and the anode of photo diode 22a is connected to +5 V power supply through resistor R11.

The collector of photo transistor 22b in photo coupler 22 is connected to a power supply of +V through resistor R12 and the emitter thereof is connected to the base of NPN transistor 24. In the same manner, the collector of photo transistor 23b in photo coupler 23 is connected to a power supply of −V and the emitter thereof is connected to the base of PNP transistor 25. Each of the emitters of NPN transistor 24 and PNP transistor 25 are connected commonly and also to output terminal T2. Diode 26 is connected between the common connection point of these emitters and the base of NPN transistor 24. Diode 27 is also connected between the common connection point of these emitters and the base of PNP transistor 25. The collectors of these two transistors are connected commonly and also to output terminal T1.

As shown in FIG. 5, the load may be connected to AC power source, or a DC power source having plus polarity or minus polarity, can be connected between output terminal T1 and output terminal T2.

The operation of the circuit will be described in the case where an AC power source and an AC load are connected.

Figure 6:
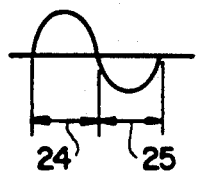
FIG. 6 is a wave form chart of the operation in FIG. 5.
Figure 7:
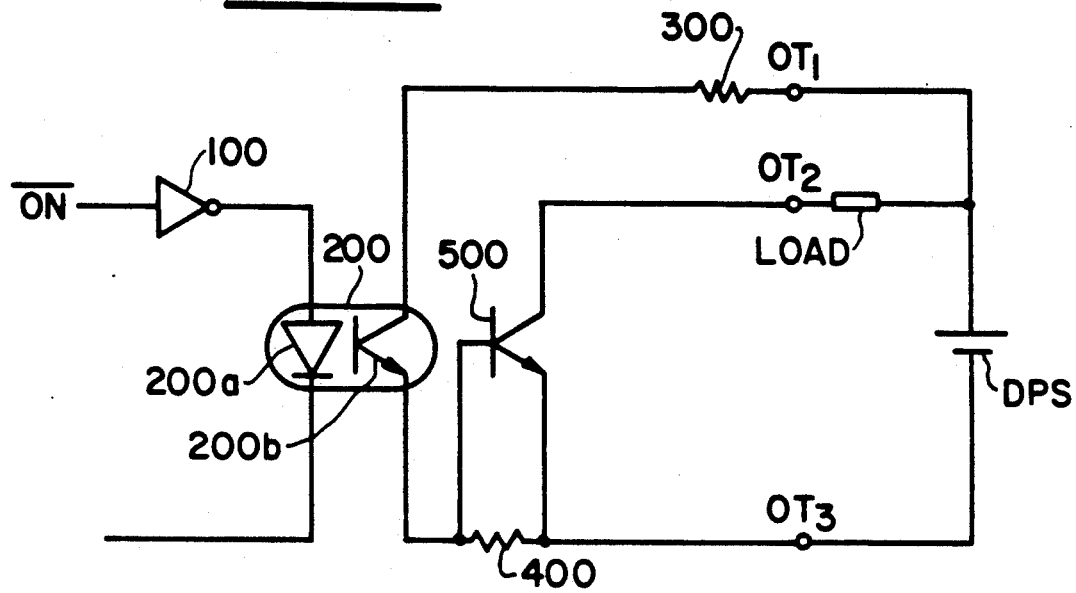
FIG. 7 is a circuit diagram used in a related art.
Figure 8:
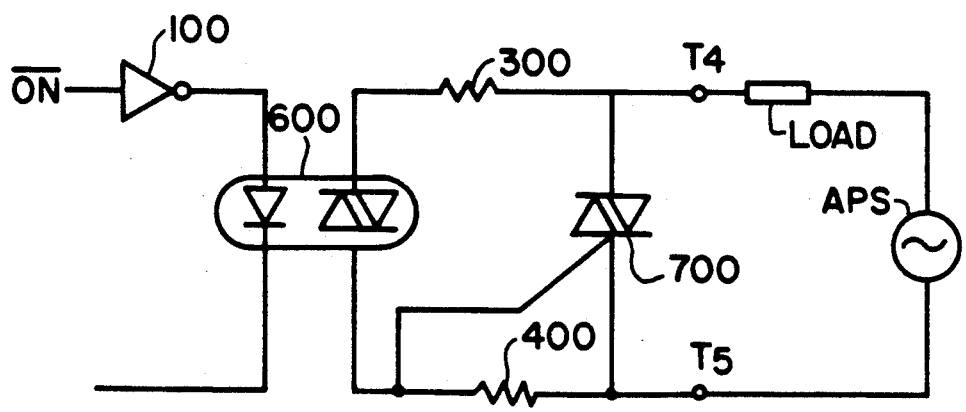
FIG. 8 is also a circuit diagram used also in a related art.

When output signal $\overline{ON}$ is "low", photo transistor 22b of photo coupler 22 and photo transistor 23b of photo coupler 23 becomes "on". This causes the bases of transistor 24 and transistor 25 to receive bias signals sufficient to turn them "on". Since transistor 24 is an NPN type transistor, transistor 25 is a PNP type transistor so that, as shown in FIG. 6, either transistor 24 or transistor 25 turn on to conduct alternatively in response to the cycle of the power source. On the other hand when output signal $\overline{ON}$ is at the "HIGH" level transistor 24 and transistor 25 are both "OFF". Accordingly it results no conduction of the circuit between output terminal T1 and output terminal T2. Also the load is not driven.

Transistor 24 and transistor 25 make it possible to turn on and turn off for either plus or a minus polarity of the power source. Accordingly it can also be used to control a load of positive polarity DC power source 31 or negative polarity DC power source 32, which are shown in FIG. 5.

As above described, in the first embodiment, a transistor having a low ON-resistance is used as the control element and a diode bridge type full wave rectification circuit is used as the drive element. Further the first embodiment may include an optical isolation circuit of a photo coupler.

In the second embodiment, the transistor in a photo coupler is used as the control element and a NPN transistor and a PNP transistor are used as the drive element.

Although, in the embodiment described above, the circuit of the present invention includes the arrangement of a transistor having a low on resistance and a full wave rectification circuit or the arrangement of two transistors of different conduction types, the present invention is not limited to these embodiments. For example, a device which can control bi-directional conduction or a circuit constituted to control for bi-directional conduction could be also applicable to the present invention.

As described above, according to the present invention, a control signal makes the control element turn ON/OFF and the output of the control element makes the bi-directional conductible drive element conduct or break, so that any loads, including AC type or DC type, could be connectable to this output module of the present invention.

In summary, this invention provides an output module which is able to deal with various kinds of power sources by preparing one kind of module.

What is claimed is:

1. An output module for controlling AC power to an AC load, and DC power of either polarity to a DC load, wherein only one of said AC or DC loads is controlled at any one time, said module comprising:

a control element having a conduction state which is selectable responsive to an input signal to be in one of a conducting state or a nonconducting state, said input signal received from a control apparatus and commanding connection of the load to the power source in the control apparatus, said control element including a first transistor having a low resistance between its controlled terminals when in the conducting state; and a drive element, including a switching structure connected to said control element which is switched based on said conduction state of said control element, and a full wave rectification circuit connected to said switching structure, said drive element selectively full wave rectifying when the switching structure is commanded to an ON state by a conduction state of said control element, input nodes of said full wave rectifier connected to the DC power source in a first DC load mode of operation and to the AC power source in a second AC load mode of operation.

2. An output module for controlling AC power and DC power of either polarity, wherein only one of said AC or DC is controlled at any one time, based on a signal received from a control apparatus, said module comprising:

a buffer, receiving and buffering said signal to produce a buffered signal;

an optical isolator structure, receiving said buffered signal from said buffer, having an first transistor as an output element, said transistor having a conduction that is switched between a conducting state and a non-conducting state by said buffered signal;

a second transistor element, having its controlling gate connected to a source of power through said first transistor of said optical isolator structure, so that when said first transistor of said optical isolator structure is in a conducting state, said controlling gate is energized, thereby switching said second transistor into its conducting state, and when said first transistor of said optical isolator is in a nonconducting state, said gate is de-energized and said second transistor is switched into its nonconducting state;

a full wave rectifier, having two opposite terminals connected to said terminals of said second transistor, and having its other two terminals, other than said two opposite terminals, connected to a circuit including a power source and a load, said power source being an AC source and a DC source at different times, and said full wave rectifier rectifying current from said source such that same polarity current is always passed, only when said second transistor is in the conducting state.

* * * * *